United States Patent [19]

Hosoi et al.

[11] Patent Number: 4,889,990
[45] Date of Patent: * Dec. 26, 1989

[54] METHOD AND APPARATUS FOR RECORDING AND REPRODUCING ELECTRON MICROSCOPE IMAGE

[75] Inventors: Yuichi Hosoi; Junji Miyahara, both of Kanagawa, Japan

[73] Assignee: Fuji Photo Film Co., Ltd., Minami-ashigara, Japan

[*] Notice: The portion of the term of this patent subsequent to Jul. 25, 2006 has been disclaimed.

[21] Appl. No.: 251,982

[22] Filed: Sep. 28, 1988

Related U.S. Application Data

[63] Continuation of Ser. No. 754,996, Jul. 15, 1985, abandoned.

[30] Foreign Application Priority Data

Jul. 19, 1984 [JP] Japan ................. 59-150175

[51] Int. Cl.$^4$ ............ H01J 37/244; G03B 42/08
[52] U.S. Cl. ....................... 250/327.2; 250/311; 250/397
[58] Field of Search .......... 250/311, 327.2 C, 484.1 B, 250/337, 397

[56] References Cited

U.S. PATENT DOCUMENTS

| | | | |
|---|---|---|---|
| 3,823,322 | 7/1974 | Willasch et al. | 250/311 |
| 3,859,527 | 1/1975 | Luckey | 250/327.2 |
| 3,883,748 | 5/1975 | Nada et al. | 250/484.1 |
| 3,975,637 | 8/1976 | Ikedo et al. | 250/327.2 |
| 4,236,078 | 11/1980 | Kotera et al. | 250/363 R |
| 4,239,968 | 12/1980 | Kotera et al. | 250/327.2 |
| 4,258,264 | 3/1981 | Kotera et al. | 250/484.1 |
| 4,276,473 | 6/1981 | Kato et al. | 250/327.2 |
| 4,315,318 | 2/1982 | Kato et al. | 364/515 |
| 4,346,295 | 8/1982 | Tanaka et al. | 250/327.2 |
| 4,387,428 | 6/1983 | Ishida et al. | 364/414 |
| 4,400,619 | 8/1983 | Kotera et al. | 250/327.2 |
| 4,543,479 | 9/1985 | Kato | 250/327.2 |

FOREIGN PATENT DOCUMENTS

| | | |
|---|---|---|
| 55-47719 | 4/1980 | Japan . |
| 55-47720 | 4/1980 | Japan . |
| 56-11395 | 2/1981 | Japan ............... 250/327.2 |
| 56-116777 | 9/1981 | Japan . |
| 57-23675 | 2/1982 | Japan . |
| 58-69281 | 4/1983 | Japan . |
| 59-56479 | 3/1984 | Japan . |
| 61-93538 | 5/1986 | Japan . |

Primary Examiner—Constantine Hannaher
Attorney, Agent, or Firm—Sixbey, Friedman, Leedom & Ferguson

[57] ABSTRACT

In a system for recording and reproducing an electron microscope image, a two-dimensional sensor for storing electron beam energy is exposed to an electron beam passing through a sample in a vacuum to have the electron beam energy stored in the two-dimensional sensor. The two-dimensional sensor is then exposed to light or heated while the vacuum is maintained to release the stored energy as light emission. The light emitted by the two-dimensional sensor is photoelectrically detected to obtain an electric signal for reproducing a visible image.

5 Claims, 3 Drawing Sheets

METHOD AND APPARATUS FOR RECORDING AND REPRODUCING ELECTRON MICROSCOPE IMAGE

BACKGROUND OF THE INVENTION

This application is a continuation of Ser. No. 754,996 filed July 15, 1985, now abandoned.

1. Field of the Invention

This invention relates to a method of recording and reproducing an electron microscope image, and an apparatus for carrying out the method. This invention particularly relates to an electron microscope image recording and reproducing method for recording an electron microscope image at high sensitivity and reproducing it by use of an electric signal so that the electric signal can be subjected to various image processings.

2. Description of the Prior Art

There have heretofore been known electron microscopes for obtaining an enlarged image of a sample by refracting an electron beam passing through the sample by use of an electric field or a magnetic field. In the electron microscope, a diffraction pattern of the sample is formed on the back focal plane of an objective lens by the electron beam passing through the sample, and the enlarged image of the sample is formed by interference of the diffracted beam. Therefore, when the enlarged image is projected by a projection lens, an enlarged image (scattering image) of the sample is observed. Also, when the diffraction pattern on the back focal plane is projected, an enlarged diffraction pattern of the sample is observed. When an intermediate lens is positioned between the objective lens and the projection lens, the aforesaid enlarged image (scattering image) or the diffraction pattern can be obtained as desired by adjusting the focal length of the intermediate lens.

In general, in order to observe the enlarged image or the diffraction pattern formed as described above (both are hereinafter generically referred to as the electron beam image), a photographic film is positioned at the image forming plane of the projection lens to record the electron beam image, or an image intensifier is used for intensifying and projecting the electron beam image. However, the method of using the photographic film has the drawback that the sensitivity of the photographic film to the electron beam is low and development processing is troublesome. On the other hand, the method of using the image intensifier is disadvantageous in that image sharpness is low and the image is readily distorted.

The aforesaid electron beam image is often subjected to an image processing such as a gradation processing, a frequency response enhancement processing, a density processing, a subtraction processing or an addition processing, reconstruction of a three-dimensional image by Fourier analysis, an image analysis for image conversion into two-valued system or grain size measurement, or a diffraction pattern processing for analysis of crystal information or measurement of grating constant, transition and grating defects. In such a case, a microscope image obtained by development of a photographic film has heretofore been detected by a microphotometer and converted into an electric signal which is then subjected to A/D conversion or the like and processed by use of a computer. This operation is very troublesome.

SUMMARY OF THE INVENTION

The primary object of the present invention is to provide a method of recording and reproducing an electron microscope image, which records and reproduces the electron microscope image with high sensitivity and high image quality.

Another object of the present invention is to provide a method of recording and reproducing an electron microscope image wherein an electric signal carrying the electron microscope image is directly obtained so that processings of the electron microscope image become very easy.

The specific object of the present invention is to provide an apparatus for carrying out the method.

The present invention provides a method of recording and reproducing an electron microscope image, which comprises the steps of:

(i) exposing a two-dimensional sensor for storing electron beam energy to an electron beam passing through a sample in a vacuum to have the electron beam energy stored in said two-dimensional sensor, (ii) exposing said two-dimensional sensor to light or heating it in said vacuum to release the stored energy as light emission, and (iii) photoelectrically detecting the emitted light.

The present invention also provides an apparatus for recording and reproducing an electron microscope image, which at least comprises:

(i) a two-dimensional sensor for storing an electron beam image formed by a distribution of electron beam energy, said two-dimensional sensor being positioned in the same vacuum system as that of an image forming plane of an electron microscope, (ii) a stimulation means for exposing said two-dimensional sensor to light or heating it while it is maintained in the vacuum, and (iii) a detection means for photoelectrically detecting light emitted by said two-dimensional sensor upon exposure to light or heating.

In the present invention, since an electron microscope image is stored in a two-dimensional sensor such as a stimulable phosphor sheet, it is possible to record the electron microscope image with high sensitivity. Therefore, it becomes possible to decrease the amount of the electron beam used for recording of the electron microscope image and to minimize damage to the sample. Also, since the recorded image can be immediately reproduced with high sensitivity and displayed on a cathode ray tube (CRT) or the like, it is possible to obtain a sharp monitor image when the reproduced image is used as a monitor image for adjustment of the focus of the electron microscope, and to conduct focus adjustment at small electron beam exposure amounts which has heretofore been impossible.

Further, in the present invention, since the electron microscope image is detected as an electric signal, it becomes very easy to carry out image processings such as gradation processing and frequency response enhancement processing on the electron microscope image. Also, by sending the electric signal to a computer, it becomes possible to conduct a diffraction pattern processing, reconstruction of a three-dimensional image, and an image analysis for image conversion into two-valued system or the like very simply and quickly.

Also, since the two-dimensional sensor for storing the electron microscope image can be erased for reuse by exposing it to light or heating it, it is possible to reproduce the electron microscope image more economically than the case where the conventional silver halide photographic system is used. Further, in the present invention, since the two-dimensional sensor is used in the same vacuum system as that of the electron beam image forming plane, it is not necessary to break the vacuum for film change or the like as in the case of the conventional photographic film, and it is possible to continuously conduct many image recording operations.

As the two-dimensional sensor, a stimulable phosphor sheet as disclosed, for example, in U.S. Pat. Nos. 4,258,264, 4,276,473, 4,315,318 and 4,387,428, and Japanese Unexamined Patent Publication No. 56(1981)-11395 is particularly suitable.

When certain kinds of phosphors are exposed to a radiation such as an electron beam, they store a part of the energy of the radiation. Then, when the phosphor which has been exposed to the radiation is exposed to stimulating rays such as visible light or is heated, the phosphor exhibits light emission or thermal fluorescence in proportion to the stored energy of the radiation. A phosphor exhibiting such properties is referred to as a stimulable phosphor. By "stimulable phosphor sheet" is meant a sheet-like recording material comprising the aforesaid stimulable phosphor. In general, the stimulable phosphor sheet is composed of a substrate and a stimulable phosphor layer overlaid on the substrate. The stimulable phosphor layer comprises an appropriate binder and the stimulable phosphor dispersed therein. When the stimulable phosphor layer is self-supporting, the stimulable phosphor layer can by itself form the stimulable phosphor sheet.

As the two-dimensional sensor, it is also possible to use a thermal phosphor sheet as disclosed, for example, in Japanese Patent Publication Nos. 55(1980)-47719 and 55(1980)47720. The thermal phosphor sheet is a sheet-like recording material comprising a phosphor (thermal phosphor) which releases the stored radiation energy as thermal fluorescence mainly by the heat effect. The thermal phosphor sheet may be made in the same manner as the aforesaid stimulable phosphor sheet.

The stimulable phosphor sheet is positioned at the image forming plane of the electron microscope and exposed to an electron beam passing through a sample to have an electron beam image stored therein. Then, the stimulable phosphor sheet carrying the electron beam image is scanned by stimulating rays such as visible light or sweep-heated to emit light. By photoelectrically detecting the emitted light, it is possible to obtain an electric signal representing the electron beam image. When the electric image signal thus obtained is used, it is possible to display the electron microscope image on a display device such as a CRT, or to permanently record the image as a hard copy, or to store the electric image signal in a storage medium such as a magnetic tape or a magnetic disk.

As the stimulable phosphor for constituting the stimulable phosphor sheet, there may be used, for example:

a phosphor represented b the formula SrS:Ce,Sm; SrS:Eu,Sm; ThO$_2$:Er; or La$_2$O$_2$S:Eu,Sm, as shown in U.S. Pat. No. 3,859,527, a phosphor represented by the formula ZnS:Cu,Pb; BaO.xAl$_2$O$_3$:Eu wherein $0.8 \leq x \leq 10$; or M$^{2+}$O.xSiO$_2$:A wherein M$^{2+}$ is Mg, Ca, Sr, Zn, Cd or Ba, A is Ce, Tb, Eu, Tm, Pb, Tl, Bi or Mn, and x is a number satisfying $0.5 \leq x \leq 2.5$, as shown in U.S. Pat. No. 4,236,078, a phosphor represented by the formula (Ba$_{1-x-y}$,Mg$_x$Ca$_y$)FX:aEu$^{2+}$ wherein X is at least one of Cl and Br, x and y are numbers satisfying $0 < x+y \leq 0.6$ and $xy \neq 0$, and a is a number satisfying $10^{-6} \leq a \leq 5 \times 10^{-2}$, as shown in DE-OS No. 2,928,245, a phosphor represented by the formula LnOX:xA wherein Ln is at least one of La, Y, Gd and Lu, X is at least one of Cl and Br, A is at least one of Ce and Tb, x is a number satisfying $0 < x < 0.1$, as shown in U.S. Pat. No. 4,236,078, a phosphor represented by the formula (Ba$_{1-x}$,M$^{II}_x$)FX:yA wherein M$^{II}$ is at least one of Mg, Ca, Sr, Zn and Cd, X is at least one of Cl, Br and I, A is at least one of Eu, Tb, Ce, Tm, Dy, Pr, Ho, Nd, Yb and Er, x is a number satisfying $0 \leq x \leq 0.6$, and y is a number satisfying $0 \leq y \leq 0.2$, as shown in U.S. Pat. No. 4,239,968, a phosphor represented by the formula M$^{II}$FX.xA:yLn wherein M$^{II}$ is at least one of Ba, Ca, Sr, Mg, Zn and Cd, A is at least one of BeO, MgO, CaO, SrO, BaO, ZnO, Al$_2$O$_3$, Y$_2$O$_3$, La$_2$O$_3$, In$_2$O$_3$, SiO$_2$, TlO$_2$, ZrO$_2$, GeO$_2$, SnO$_2$, Nb$_2$O$_5$, Ta$_2$O$_5$ and ThO$_2$, Ln is at least one of Eu, Tb, Ce, Tm, Dy, Pr, Ho, Nd, Yb, Er, Sm and Gd, X is at least one of Cl, Br and I, x and y numbers satisfying $5 \times 10^{-5} \leq x \leq 0.5$ and $0 < y \leq 0.2$, as shown in Japanese Unexamined Patent Publication No. 55(1980)-160078, a phosphor represented by the formula (Ba$_{1-x}$,M$^{II}_x$)F$_2$.aBaX$_2$:yEu,zA wherein M$^{II}$ is at least one of beryllium, magnesium, calcium, strontium, zinc and cadmium, X is at least one of chlorine, bromine and iodine, A is at least one of zirconium and scandium, and a, x, y and z are numbers satisfying $0.5 \leq a \leq 1.25$, $0 \leq x \leq 1$, $10^{-6} \leq y \leq 2 \times 10^{-1}$ and $0 < z \leq 10^{-2}$, as shown in Japanese Unexamined Patent Publication No. 56(1981)-16777, a phosphor represented by the formula (Ba$_{1-x}$,M$^{II}_x$)F$_2$.aBaX$_2$:yEu,zB wherein M$^{II}$ is at least one of beryllium, magnesium, calcium, strontium, zinc and cadmium, X is at least one of chlorine, bromine and iodine, and a, x, y and z are numbers satisfying $0.5 \leq a \leq 1.25$, $0 \leq x \leq 1$, $10^{-6} \leq y \leq 2 \times 10^{-1}$ and $0 < z \leq 10^{-1}$, as shown in Japanese Unexamined Patent Publication No. 57(1982)-23673, a phosphor represented by the formula (Ba$_{1-x}$,M$^{II}_x$)F$_2$.aBaX$_2$:yEu,zA wherein M$^{II}$ is at least one of beryllium, magnesium, calcium, strontium, zinc and cadmium, X is at least one of chlorine, bromine and iodine, A is at least one of arsenic and silicon, and a, x, y and z are numbers satisfying $0.5 \leq a \leq 1.25$, $0 \leq x \leq 1$, $10^{-6} \leq y \leq 2 \times 10^{-1}$ and $0 < z \leq 5 \times 10^{-1}$, as shown in Japanese Unexamined Patent Publication No. 57(1982)-23675, a phosphor represented by the formula M$^{III}$OX:xCe wherein M$^{III}$ is at least one trivalent metal selected from the group consisting of Pr, Nd, Pm, Sm, Eu, Tb, Dy, Ho, Er, Tm, Yb and Bi, X is at least one of Cl and Br, and x is a number satisfying $0 < x < 0.1$, as shown in Japanese Unexamined Patent Publication No. 58(1983)-69281, a phosphor represented by the formula Ba$_{1-x}$M$_{x/2}$L$_{x/2}$FX:yEu$^{2+}$ wherein M is at least one alkaline metal selected from the group consisting of Li, Na, K, Rb and Cs, L is at least one trivalent metal selected from the group consisting of Sc, Y, La, Ce, Pr, Nd, Pm, Sm, Gd, Tb, Dy, Ho, Er, Tm, Yb, Lu, Al, Ga, In and Tl, X is at least one halogen selected from the group consisting of Cl, Br and I, x is a number satisfying $10^{-2} \leq x \leq 0.5$, and y is a number satisfying $0 < y \leq 0.1$, as shown in Japanese Unexamined Patent Publication No. 58(1983)-206678, a phosphor represented by the formula BaFX.xA:yEu$^{2+}$ wherein X is at least one halogen selected from the group consisting of Cl, Br and I, A is a firing product of tetrafluoroboric acid compound, x is a number satisfying $10^{-6} \leq x \leq 0.1$, and y is a number satisfying $0 < y \leq 0.1$, as shown in Japanese Unexamined Patent Publication No. 59(1984)-27980, a phosphor represented by the formula BaFX.xA:yEu$^{2+}$ wherein X is at least one halogen selected from the group consisting of Cl, Br and I, A is a firing product of at least one compound selected from the hexafluoro compound group consisting of salts of hexafluorosilicic acid, hexafluorotitanic acid and hexafluorozirconic acid with monovalent or bivalent metals, x is a number satisfying $10-6 \leq x \leq 0.1$, and y is a number satisfying $0 < y \leq 0.1$, as shown in Japanese Unexamined Patent Publication No. 59(1984)-47289, a phosphor represented by the formula BaFX.xNaX':aEu$^{2+}$ wherein each of X and X' is at least one of Cl, Br and I, x and a are numbers satisfying $0 < x \leq 2$ and $0 < a \leq 0.2$, as shown in Japanese Unexamined Patent Publication No. 59(1984)-56479, a phosphor represented by the formula M$^{II}$FX.xNaX':yEu$^{2+}$:zA wherein M$^{II}$ is at least one alkaline earth metal selected from the group consisting of Ba, Sr and Ca, each of X and X' is at least one halogen selected from the group consisting of Cl, Br and I, A is at least one transition metal selected from the group consisting of V, Cr, Mn, Fe, Co and Ni, x is a number satisfying $0 < x \leq 2$, y is a number satisfying $0 < y \leq 0.2$, and z is a number satisfying $0 < z \leq 10^{-2}$, as shown in Japanese Unexamined Patent Publication No. 59(1984)-56480, or a phosphor represented by the formula M$^{II}$FX.aM$^{I}$X'.bM'$^{II}$X"$_2$.cM$^{III}$X'"$_3$.xA:yEu$^{2+}$ wherein M$^{II}$ is at least one alkaline earth metal selected from the group consisting of Ba, Sr and Ca, M$^{I}$ is at least one alkaline metal selected from the group consisting of Li, Na, K, Rb and Cs, M'II is at least one bivalent metal selected from the group consisting of Be and Mg, M$^{III}$ is at least one trivalent metal selected from the group consisting of Al, Ga, In and Tl, A is a metal oxide, X is at least one halogen selected from the group consisting of Cl, Br and I, each of X', X" and X'" is at least one halogen selected from the group consisting of F, Cl, Br and I, a, b and c are numbers satisfying $0 \leq a \leq 2$, $0 \leq b \leq 10^{-2}$, $0 \leq c \leq 10^{-2}$, and $a+b+c \geq 10^{-6}$, x and y are numbers satisfying $0 < x \leq 0.5$, and $0 < y \leq 0.2$, as shown in Japanese Unexamined Patent Publication No. 59(1984)-75200.

However, the stimulable phosphor used in the present invention is not limited to the above enumerated phosphors, and any other phosphors may be used insofar as they can emit light when they are exposed to stimulating rays after being exposed to a radiation.

As the thermal phosphor, it is possible to use sulfate compounds such as $Na_2SO_4$, $MnSO_4$, $CaSO_4$, $SrSO_4$, and $BaSO_4$ added with a small amount of at least one of additives such as Mn, Dy and Tm.

The phosphor sheet may be provided with a protective layer or a light reflecting or light absorbing prime layer. The phosphor layer of the phosphor sheet may be colored with pigments or dyes as disclosed in U.S. Pat. No. 4,346,295.

DESCRIPTION OF THE PREFERRED EMBODIMENTS

The present invention will hereinbelow be described in further detail with reference to the accompanying drawings.

Figure 1:
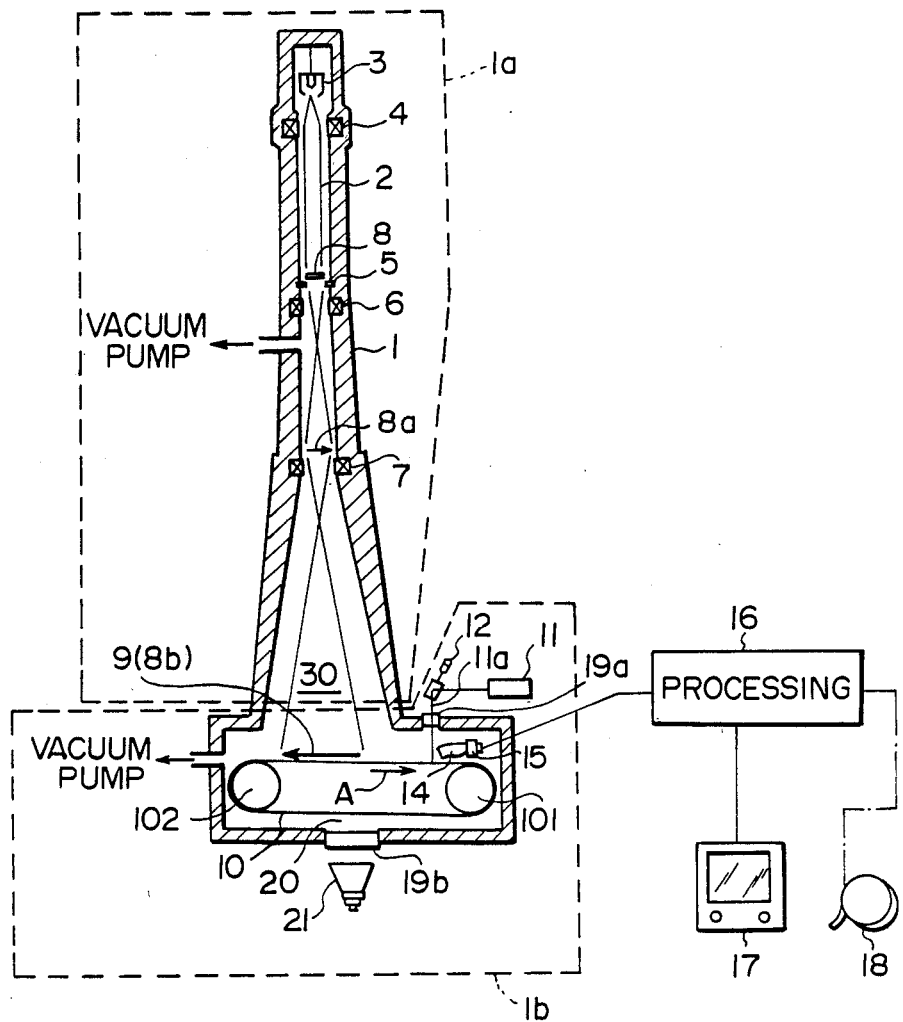
FIG. 1 is a schematic view showing an embodiment of the apparatus for recording and reproducing an electron microscope image in accordance with the present invention.

Referring to FIG. 1, an apparatus 1 for recording and reproducing an electron microscope image comprises a microscope body section 1a of an ordinary electron microscope, and a recording and read-out section 1b positioned under the microscope body section 1a. The recording and read-out section 1b comprises a stimulable phosphor sheet 10 positioned as a two-dimensional sensor so that it belongs to the same vacuum system as that of the electron beam image forming plane at least at the time of exposure to an electron beam (i.e. recording of an electron beam image), a stimulation means for scanning the stimulable phosphor sheet 10 with stimulating rays while the sheet 10 is maintained in a vacuum, and a detection means for photoelectrically detecting light emitted by the sheet 10. The inside of the hatched frame of the microscope body section 1a and the inside of the hatched frame of the recording and read-out section 1b are maintained in a vacuum by a known means during operation of the electron microscope.

The microscope body section 1a is provided with an electron gun 3 for emitting an electron beam 2 at a uniform speed, at least one converging lens 4 constituted by a magnetic lens or an electrostatic lens for converging the electron beam 2 onto a sample plane, a sample supporting base 5, and an objective lens 6 and a projection lens 7 of the same type as the converging lens 4. The electron beam 2 passing through a sample 8 placed on the sample supporting base 5 is refracted by the objective lens 6 to form an enlarged scattering image 8a of the sample 8. The enlarged scattering image 8a is projected by the projection lens 7 onto an image forming plane 9 and forms an image 8b.

The recording and read-out section 1b is provided with the stimulable phosphor sheet 10 in the form of an endless belt applied around a cylindrical drive roller 101 and a cylindrical driven roller 102, the stimulation means comprising a stimulating ray source 11 constituted by a He-Ne laser tube or the like and a light deflector 12 constituted by a galvanometer mirror or the like for deflecting a beam 11a of stimulating rays emitted by the stimulating ray source 11 in the width direction of the sheet 10, and the detection means comprising a light guide member 14 for guiding the light emitted by the sheet 10 when the sheet 10 is exposed to the stimulating rays, and a photoelectric converter 15 constituted by a photomultiplier or the like and positioned in close contact with a light output face of the light guide member 14 for converting the light guided by the light guide member 14 into an electric signal. The endless belt-like stimulable phosphor sheet 10 is fabricated by overlaying a stimulable phosphor layer on the surface of an endless belt-like substrate. The sheet 10 is applied around the drive roller 101 and the driven roller 102 and is rotatable in the direction as indicated by the arrow A by the drive roller 101 rotated by a drive unit (not shown).

In this embodiment, the endless belt-like stimulable phosphor sheet 10, the drive roller 101, the driven roller 102, the light guide member 14 and the photoelectric converter 15 are positioned in the vacuum system. However, it is also possible to position the light guide member 14 so that the end portion thereof is projected out of the vacuum system through the hatched frame. In this case, it is possible to position the photoelectric converter 15 outside of the vacuum system.

When a shutter (not shown) positioned between the microscope body section 1a and the recording and read-out section 1b is opened, electron beam energy corresponding to the enlarged scattering image 8b of the sample 8 is stored in the portion of the stimulable phosphor sheet 10 positioned at the image recording section, i.e. the image forming plane 9. Then, this portion of the stimulable phosphor sheet 10 is moved to the image read-out section by the rotation of the drive roller 101. In this embodiment, the stimulating ray beam 11a for scanning the endless belt-like stimulable phosphor sheet 10 in the width direction is made to impinge upon the sheet 10 via a light-permeable wall member 19a, fabricated of lead glass or the like, by use of the stimulating ray source 11 constituted by a laser beam source or the like and the light deflector 12 constituted by a galvanometer mirror which are positioned outside of the hatched frame. While the stimulating ray beam 11a impinges upon the stimulable phosphor sheet 10, the sheet 10 is moved in the direction as indicated by the arrow A normal to the width direction of the sheet 10 by the drive roller 101. In this manner, the portion of the sheet 10 carrying the electron beam image is scanned by the stimulating ray beam 11a. Light emitted by the stimulable phosphor sheet 10 upon exposure to the stimulating ray beam 11a enters the light guide member 14 from the light input face thereof facing the sheet 10, and is guided through total reflection up to the light output face of the light guide member 14. The guided light is received and photoelectrically detected by the photomultiplier 15 closely contacted with the light output face of the light guide member 14.

The electric signal generated by the photomultiplier 15 is processed by an image processing circuit 16 and sent to an image reproducing device which may be a display device 17 constituted by a CRT, or a device for recording an image by optical scanning on a photographic film, or may comprise a storage device 18 using a magnetic tape or the like.

The size of the reproduced image is desired to be enlarged into a size larger than the area of the originally stored image stored in said two-dimensional sensor.

Figure 3:
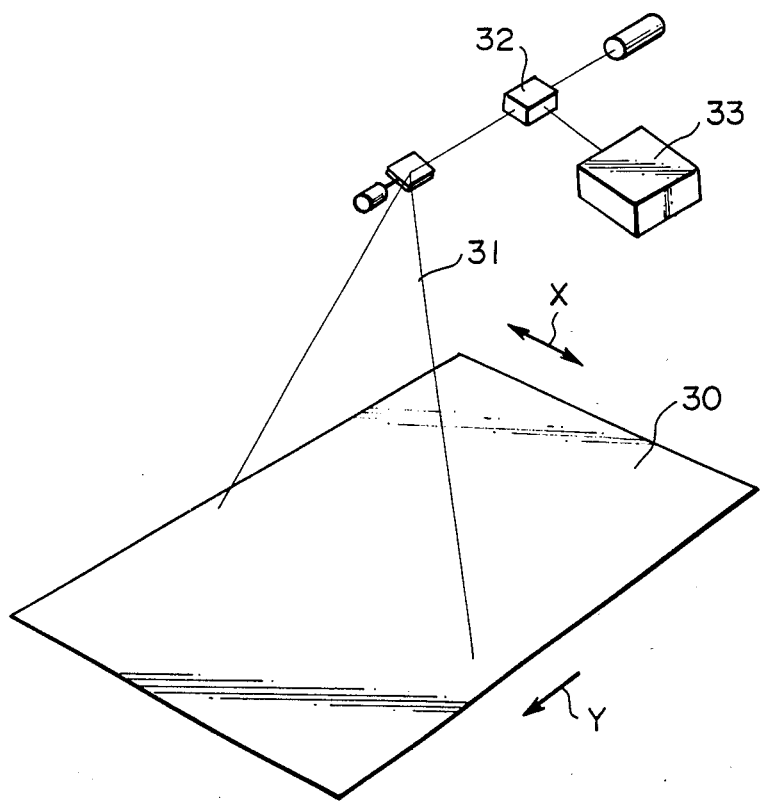
FIG. 3 is an image scanning recording apparatus used in accordance with the present invention.

FIG. 3 shows an image scanning recording apparatus as an example of a reproducing apparatus. A visible image is obtained on a photosensitive film 30 by moving the photosensitive film 30 into the direction of subscanning as indicated by arrow Y and having a laser beam 31 scan in the direction of main scanning as indicated by arrow X and further modulating the laser beam 31 by an acousto-optical modulator 32 according to the image signal from the image processing circuit 33.

The size of the visible image reproduced on the photosensitive film 30 is made larger than the size of the image forming plane 9 (i.e. the area of the originally stored image on the two-dimensional sensor), and the enlarged scattering image 8b is reproduced into a larger scale than on the image forming plane 9. If the stimulable phosphor sheet 10 is used, said enlarged scattering image 8b is reproduced with high sharpness. Accordingly, by using the stimulable phosphor, an image of sufficiently high quality can be reproduced if it is enlarged as mentioned above. In such a case, therefore, a small size of the stimulable phosphor sheet 10 can be used and a small size of the photosensor 15 as well can be used, thereby making the apparatus small in size as a whole.

In order to output an enlarged image by the image scanning recording apparatus as shown in FIG. 3, density or pitch of the scanning lines at the time of reproducing images is made lower or larger than that at the time of reading out the image from the stimulable phosphor sheet 10. In order to obtain sufficient amount of information of images from the small size of stimulable phosphor sheet, it is desirable to make the density or pitch of the scanning lines at the time of reading out images not more than 10 pixel/mm or more preferably in the range of 15 to 100 pixel/mm. In the case of reproducing images, the density or pitch of the scanning lines is desired to be made lower or larger than that used for reading out images in the range of 5 to 20 pixel/mm, whereby it is possible to reproduce an enlarged image without lowering the quality of the image.

After the electron beam image is read from the portion of the endless belt-like stimulable phosphor sheet 10 carrying the electron beam image stored therein, the sheet portion is moved to an erasing zone 20 at which the sheet 10 is exposed to erasing light emitted by an erasing light source 21, constituted by a fluorescent lamp or the like and positioned outside of the vacuum system, and passing through a light-permeable wall member 19b. The erasing light source 21 emits the erasing light having a wavelength distribution within the stimulation wavelength range of the stimulable phosphor constituting the stimulable phosphor sheet 10 to the sheet 10, thereby erasing the electron beam energy remaining in the stimulable phosphor layer of the sheet 10 and releasing noise caused by radioactive isotopes contained in the raw material of the sheet 10. The erasing light source 21 may, for example, be a fluorescent lamp as mentioned above or be a tungsten-filament lamp, a halogen lamp, an infrared lamp or a laser beam source as described in U.S. Pat. No. 4,400,619.

Figure 2:
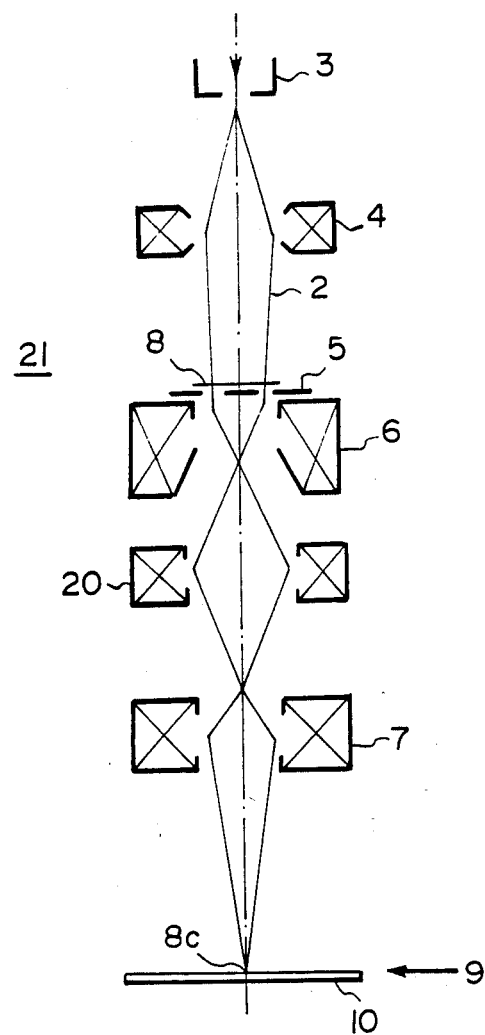
FIG. 2 is a schematic view showing a part of another embodiment of the apparatus in accordance with the present invention.

In the aforesaid embodiment, the enlarged scattering image of the sample 8 formed by the electron beam passing through the sample 8 is recorded and reproduced. However, the present invention is also applicable to recording and reproducing of a diffraction pattern of a sample. FIG. 2 shows another embodiment of the present invention, wherein a diffraction pattern of the sample 8 is recorded. In this embodiment, an electron microscope 21 is provided with an intermediate lens 20 positioned between the objective lens 6 and the projection lens 7. The diffraction pattern 8c of the sample 8 formed on the back focal plane of the objective lens 6 is enlarged and projected onto the image forming plane 9 by the intermediate lens 20 having a focal point matched to the back focal plane of the objective lens 6, and the projection lens 7. In this case, too, when the stimulable phosphor sheet 10 is positioned as the two-dimensional sensor at the image forming plane 9, an enlarged image of the diffraction pattern 8c formed by the electron beam 2 passing through the sample 8 is stored in the sheet 10. The diffraction pattern 8c stored in the sheet 10 can be read out in the same manner as described with reference to FIG. 1, and the read-out image can be displayed on a CRT or reproduced as a hard copy.

In order to obtain an electron microscope image free from adverse effects of a fluctuation in the recording conditions or exhibiting a high image quality suitable for viewing purposes, it is advantageous that the image recording information such as the recording condition of the electron beam image (the enlarged scattering image or the enlarged diffraction pattern) stored in the stimulable phosphor sheet 10, the properties of the sample, or the recording pattern fixed by the recording method or the like be ascertained prior to the output of a visible image for viewing purposes, and the read-out gain be adjusted to an appropriate value and/or an appropriate signal processing be conducted on the basis of the ascertained image recording information.

Also, in order to obtain a reproduced image suitable for viewing purposes, it is necessary to select the scale factor in accordance with the contrast of the recording pattern so that resolution is optimized.

The image recording information on the stimulable phosphor sheet 10 can be ascertained prior to the visible image reproduction by use of the method disclosed in Japanese Unexamined Patent Publication No. 58(1983)-89245. Specifically, a read-out operation for ascertaining the image recording information stored in the stimulable phosphor sheet 10 (preliminary read-out) is conducted in advance by use of stimulating rays having stimulation energy of a level lower than the level of the stimulation energy of stimulating rays used in a subsequent read-out operation for obtaining a visible image for viewing purposes (final read-out), and thereafter the final read-out is carried out. In the final read-out, the read-out gain is adjusted, and/or an appropriate signal processing is conducted on the basis of the image recording information obtained by the preliminary read-out.

As the photoelectric read-out means for detecting the light emitted by the stimulable phosphor sheet 10, instead of the photomultiplier 15, it is also possible to use a solid state photoelectric conversion device such as a photoconductor or a photodiode as described, for example, in Japanese Patent Application Nos. 58(1983)-86226, 58(1983)-86227, 58(1983)-219313 and 58(1983)-219314, and Japanese Unexamined Patent Publication No. 58(1983)-121874. In this case, many solid state photoelectric conversion devices are fabricated to cover the whole surface of the sheet 10. They may be positioned integrally with the sheet 10 or close to the sheet 10. Also, the photoelectric read-out means may be a line sensor comprising many photoelectric conversion devices arrayed linearly, or a single solid state photoelectric conversion device corresponding to a single picture element may be moved to scan the whole surface of the sheet 10.

As the read-out light source in the aforesaid case, a linear light source comprising light emitting diodes or semiconductor lasers arrayed linearly may be used instead of the point light source such as a laser. By conducting image read-out by use of such devices, it is possible to prevent a loss of the light emitted by the stimulable phosphor sheet 10 and to improve the signal-to-noise ratio by increasing the light receiving solid angle. Also, since electric signals are sequentially obtained not by sequential exposure of the sheet 10 to stimulating rays but by the electric processing of the photodetector, it is possible to increase the read-out speed.

For making the stimulable phosphor sheet 10 release the stored energy by heating, instead of using the stimulating rays, a heating source such as a $CO_2$ laser for emitting heat rays may be used, and the sheet 10 may be scanned with the heat rays as described, for example, in Japanese Patent Publication No. 55(1980)-47720.

I claim:

1. A method of recording and reproducing an electron microscope image, which comprises the steps of:
   (i) exposing a two-dimensional sensor for storing electron beam energy to an electron beam passing through a sample in a vacuum to have the electron beam energy stored in said two-dimensional sensor, said two-dimensional sensor being a stimulable phosphor sheet where the sensitivity of the stimulable phosphor sheet to said electron beam is greater than that of a photographic film such that a lower amount of the electron beam can be used to minimize damage to the sample,
   (ii) exposing said two-dimensional sensor to light in said vacuum to release the stored energy as light emission, and
   (iii) photoelectrically detecting the emitted light.

2. A method as defined in claim 1 wherein said stimulable phosphor sheet is used as said two-dimensional sensor, said stimulable phosphor sheet is exposed to said electron beam passing through said sample in said vacuum to have the electron beam energy stored in said stimulable phosphor sheet, said stimulable phosphor sheet is then scanned with stimulating rays in said vacuum to emit light, and the emitted light is detected photoelectrically.

3. A method as defined in claim 2 wherein said stimulable phosphor sheet is an endless belt-like sheet and is rotatably positioned around rollers.

4. An apparatus for recording and reproducing an electron microscope image, which at least comprises:
   (i) a two-dimensional sensor for storing electron beam image formed by a distribution of electron beam energy, said two-dimensional sensor being positioned in the same vacuum system as that of an image forming plane of an electron microscope, said two-dimensional sensor being a stimulable phosphor sheet where the sensitivity of the stimulable phosphor sheet to said electron beam is greater than that of a photographic film such that a lower amount of the electron beam can be used to minimize damage to the sample,
   (ii) a stimulation means for exposing said two-dimensional sensor to light while it is maintained in the vacuum, and
   (iii) a detection means for photoelectrically detecting light emitted by said two-dimensional sensor upon exposure to said light.

5. An apparatus as defined in claim 4 wherein said stimulable phosphor sheet is an endless belt-like sheet and is rotatably positioned around rollers.

* * * * *